US009260796B2

United States Patent
Hoshi et al.

(10) Patent No.: US 9,260,796 B2
(45) Date of Patent: Feb. 16, 2016

(54) METHOD FOR MEASURING DISTANCE BETWEEN LOWER END SURFACE OF HEAT INSULATING MEMBER AND SURFACE OF RAW MATERIAL MELT AND METHOD FOR CONTROLLING THEREOF

(75) Inventors: Ryoji Hoshi, Nishishirakawa (JP); Masahiko Urano, Nishishirakawa (JP); Susumu Sonokawa, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 1173 days.

(21) Appl. No.: 12/448,845

(22) PCT Filed: Jan. 10, 2008

(86) PCT No.: PCT/JP2008/000012
§ 371 (c)(1),
(2), (4) Date: Jul. 10, 2009

(87) PCT Pub. No.: WO2008/096518
PCT Pub. Date: Aug. 14, 2008

(65) Prior Publication Data
US 2010/0064964 A1    Mar. 18, 2010

(30) Foreign Application Priority Data

Feb. 8, 2007   (JP) .................................. 2007-029091

(51) Int. Cl.
*C30B 15/00*    (2006.01)
*C30B 15/26*    (2006.01)
(Continued)

(52) U.S. Cl.
CPC .................. *C30B 15/26* (2013.01); *C30B 15/14* (2013.01); *C30B 15/20* (2013.01); *C30B 29/06* (2013.01)

(58) Field of Classification Search
CPC ........ C30B 29/06; C30B 15/14; C30B 15/20; C30B 15/00; C30B 15/26; C30B 15/002; Y10T 117/1032; Y10T 117/1008; Y10S 117/917; Y10S 117/904
See application file for complete search history.

(56) References Cited

U.S. PATENT DOCUMENTS 4,619,730 A * 10/1986 Suzuki et al. .................... 117/32
5,419,277 A * 5/1995 Urano et al. ................... 117/201
(Continued)

FOREIGN PATENT DOCUMENTS

EP    2 011 905 A1    1/2009
JP    U-3-96356    10/1991
(Continued)

OTHER PUBLICATIONS

Ueki et al; "Analysis of Side-Wall Structure of Grown-in Twin-Type Octahedral Defects in Czochralski Silicon;" *Japan Journal of Applied Physics*; 1998; pp. 1667-1670; vol. 37, No. 4A.
(Continued)

*Primary Examiner* — Yelena G Gakh
(74) *Attorney, Agent, or Firm* — Oliff PLC

(57) ABSTRACT

A method for measuring a distance between a lower end surface of a heat insulating member and a surface of a raw material melt with a reference reflector provided at a lower end of the heat insulating member which is located above the surface of the raw material melt when a silicon single crystal is pulled up by a Czochralski method while a magnetic field is applied to the raw material melt in a crucible is disclosed. The method comprises the steps of contacting a projection made of quartz, silicon or carbon with the surface of the raw material melt, the projection being longer that the reference reflector and having a length corresponding to an initial distance; electrically detecting the contact between the projection and the melt surface, and observing an initial location of a mirror image of the reference reflector by a camera when the distance between the lower end surface of the heat insulating member and the surface of the raw material melt has been adjusted so as to be the initial distance, the mirror image being reflected on the surface of the raw material melt; and while pulling the silicon single crystal, measuring a travel distance of the mirror image from the initial location by the camera and calculating the distance between the lower end surface of the heat insulating member and the surface of the raw material melt from the initial travel distance of the mirror image.

9 Claims, 7 Drawing Sheets

(51) Int. Cl.
   *C30B 15/14*   (2006.01)
   *C30B 15/20*   (2006.01)
   *C30B 29/06*   (2006.01)

(56) References Cited

U.S. PATENT DOCUMENTS

| | | | |
|---|---|---|---|
| 5,437,242 | A | 8/1995 | Hofstetter et al. |
| 5,487,354 | A | 1/1996 | von Ammon et al. |
| 5,911,823 | A | 6/1999 | Sonoda et al. |
| 5,911,826 | A | 6/1999 | Hiraishi et al. |
| 6,171,391 | B1 * | 1/2001 | Fuerhoff et al. ............... 117/14 |
| 6,977,010 | B2 * | 12/2005 | Inagaki et al. ............... 117/217 |
| 2002/0029738 | A1 | 3/2002 | Takanashi et al. |
| 2005/0022722 | A1 | 2/2005 | Takanashi et al. |

FOREIGN PATENT DOCUMENTS

| | | |
|---|---|---|
| JP | A-4-328425 | 11/1992 |
| JP | A-6-56588 | 3/1994 |
| JP | A-6-116083 | 4/1994 |
| JP | A-7-257991 | 10/1995 |
| JP | A-7-277879 | 10/1995 |
| JP | A-09-165298 | 6/1997 |
| JP | A-09-175895 | 7/1997 |
| JP | A-10-001388 | 1/1998 |
| JP | A-11-12079 | 1/1999 |
| JP | A-2001-342095 | 12/2001 |
| JP | A-2002-527341 | 8/2002 |
| JP | A-2004-67441 | 3/2004 |
| JP | A-2005-15290 | 1/2005 |
| JP | A-2005-170773 | 6/2005 |
| JP | A-2005-187244 | 7/2005 |
| WO | WO 00/22200 A1 | 4/2000 |

OTHER PUBLICATIONS

Takeno et al; "Evaluation of Microdefects in As-Grown Silicon Crystals;" *Materials Research Society Symposium*; 1992; pp. 51-56; vol. 262.

Voronkov; "The Mechanism of Swirl Defects Formation in Silicon;" *Journal of Crystal Growth*; 1982; pp. 625-643; vol. 59, No. 3; North-Holland Publishing Company, Amsterdam.

Hourai et al; "Control of Grown-in Defects in Si Crystal Growth;" *Japanese Association for Crystal Growth*; 1998; pp. 207-213; vol. 25, No. 5; Japan.

May 7, 2012 Search Report issued in European Patent Application No. 08702753.8.

Aug. 14, 2012 Office Action issued in Japanese Patent Application No. 2007-029091 w/partial translation.

Feb. 25, 2014 Korean Office Action issued in Korean Patent Application No. 10-2009-7016551 (with partial English-language Translation).

* cited by examiner (a)

(b)

METHOD FOR MEASURING DISTANCE BETWEEN LOWER END SURFACE OF HEAT INSULATING MEMBER AND SURFACE OF RAW MATERIAL MELT AND METHOD FOR CONTROLLING THEREOF

TECHNICAL FIELD

The present invention relates to a method for measuring a distance between a lower end surface of a heat insulating member arranged above a surface of a raw material melt and the surface of the raw material melt when a single crystal is pulled by a Czochralski method from the raw material melt in a crucible, and also relates to a method for controlling the distance.

BACKGROUND ART

As a method for manufacturing a silicon single crystal used for manufacturing a semiconductor device, a Czochralski method (CZ method) for growing and at the same time pulling a silicon single crystal from a raw material melt in a quartz crucible is widely performed. In a CZ method, a seed crystal is dipped in a raw material melt (a silicon melt) in a quartz crucible in an inert gas atmosphere, and then both the quartz crucible and the seed crystal are rotated and at the same time the seed crystal is pulled so as to grow a silicon single crystal of a desired diameter.

In recent years, grown-in defect in a silicon wafer becomes a problem due to the development of high integration and the resulting miniaturization of semiconductor devices. Crystal defect is a factor degrading characteristics of semiconductor devices, and influences more increasingly with the development of miniaturization of a device. As such a grown-in defect, octahedral void-state defect, which is an aggregate of vacancies in the silicon single crystal produced by a CZ method (See Analysis of side-wall structure of grown-in twin-type octahedral defects in Czochralski silicon, Jpn. J. Appl. Phys. Vol. 37 (1998) p-p. 1667-1670), a dislocation cluster formed as an aggregate of interstitial silicon (See Evaluation of micro defects in as-grown silicon crystals, Mat. Res. Soc. Symp. Proc. Vol. 262 (1992) p-p 51-56) and the like are known.

It is shown that the introduced amount of each of these grown-in defects is determined by temperature gradient of the crystal on its growing interface and the growth rate of the silicon single crystal. (See the mechanism of swirl defects formation in silicon, Journal of Crystal growth, 1982, p-p 625-643.) As methods for manufacturing a low-defect silicon single crystal utilizing this principle, publication of Unexamined Japanese Patent Application No. H6-56588, for example, discloses a method slowing the growth rate of the silicon single crystal, while publication of Unexamined Japanese Patent Application No. H7-257991 discloses a method for pulling the silicon single crystal at a rate not exceeding the maximum pulling rate which is approximately proportional to the temperature gradient of the boundary region between the solid phase and the liquid phase of the silicon single crystal. Other methods such as an improved CZ method in which the temperature gradient (G) and growth rate (V) during the crystal growth are focused (See "Japanese Association for Crystal Growth", vol. 25, No. 5, 1998) are also reported. It is thus necessary to control highly precisely the temperature gradient of the crystal.

In these methods, a structure (heat insulating member) for insulating radiant heat in a form of a cylinder or an inverted cone is provided around the silicon single crystal to be grown above the melt surface so as to control the temperature gradient of the crystal. Since the temperature gradient of the crystal at a high temperature of the crystal can be thereby increased, it is advantageous for obtaining a defect-free crystal at a high speed. In order to control accurately the temperature gradient of the crystal, however, the distance between the surface of the raw material melt and the lower end surface of the heat insulating member located above the surface of the raw material melt (hereinafter, sometimes referred to as DPM) is necessary to be controlled highly precisely to be a predetermined distance. It has been difficult with a conventional method, however, to control the DPM precisely such that the DPM is the predetermined distance.

In addition, as the crystal diameter increases, the location of the melt surface varies very much depending on the weight (varying thickness), deformation during operation and expansion of the quartz crucible, so that the location of the melt surface varies per batch of the crystal growth, which is a problem. Therefore, it becomes more difficult to control the interval between the melt surface and the heat insulating member precisely such that the interval is a predetermined interval.

In order to improve these problems, it is proposed in publication of Unexamined Japanese Patent Application No. H6-116083, for example, to provide a reference reflector in a CZ furnace and to measure a relative distance between a real image of the reference reflector and a mirror image of the reference reflector reflected on the melt surface so as to measure the distance between the reference reflector and the melt surface. This method is for precisely controlling the interval between the melt surface and the heat insulating member based on the measurement result such that the interval is a predetermined interval.

Furthermore, publication of Unexamined Japanese Patent Application No. 2001-342095 discloses a method in which curve of the raw material melt due to the rotation of the crucible is considered in order to obtain the stability of the mirror image of the reference reflector.

In these methods, the real image of the reference reflector and the mirror image of the reference reflector are captured by a detecting means such as an optical camera or the like. The brightness of the captured real and mirror images of the reference reflector is quantized to two levels (binarization process) by determining a constant threshold (threshold for binarization level). In other words, a brighter location and a darker location than the threshold for binarization level are distinguished. Then by measuring where the edge is located and by converting the measured value, the distance between the real image and the mirror image is measured.

However, there is a problem that the distance between the reference reflector and the melt surface cannot be stably and accurately measured since the brightness of the mirror image of the reference reflector reflected on the melt surface is changed over the time period of the crystal growth process and as a result a detection value by the optical camera before the binarization varies, or since a noise which is not a mirror image of the reference reflector such as a splash of melt attached to a structural part in the CZ furnace is detected.

As an another problem, if a raw material melt is contained in a quartz crucible having a bore diameter of 800 mm or more, and a silicon single crystal having a diameter of 300 mm or more is manufactured without applying a magnetic field, the melt surface is fluctuated, so that an accurate location of the melt surface cannot be stably detected. A relative distance between the reference reflector and the melt surface cannot be measured stably and accurately in this case either.

If the measuring result of the relative distance between the reference reflector and the melt surface is inaccurate, the interval between the melt surface and the heat insulating member cannot be controlled precisely to be a determined interval. As a result, a silicon single crystal with a desired quality cannot be manufactured with preferable productivity.

DISCLOSURE OF THE INVENTION

The present invention has been made in view of the above-mentioned problems, and an object of the present invention is to provide a measuring method for measuring stably and more accurately the distance between the lower end surface of the heat insulating member and the surface of the raw material melt. Another object of the present invention is to manufacture a high-quality silicon single crystal with a free-defect region precisely by utilizing this measuring method in order to manufacture the silicon single crystal.

In order to achieve the above-mentioned objects, the present invention provides a method for measuring a distance between a lower end surface of a heat insulating member and a surface of a raw material melt when a silicon single crystal is pulled by a Czochralski method while a magnetic field is applied to the raw material melt in a crucible, a reference reflector being located at the lower end of the heat insulating member which is located above the surface of the raw material melt, characterized in that the method comprises at least steps of: actually measuring the distance between the lower end surface of the heat insulating member and the surface of the raw material melt; observing a location of a mirror image of the reference reflector reflected on the surface of the raw material melt by a fixed-point observing apparatus; subsequently measuring a travel distance of the mirror image by the fixed-point observing apparatus while pulling the silicon single crystal; and calculating the distance between the lower end surface of the heat insulating member and the surface of the raw material melt, from the actually measured value and the travel distance of the mirror image.

As mentioned above, in the present invention, the silicon single crystal is pulled while a magnetic field is applied. Since convection of the raw material melt is thereby suppressed and as a result waviness of front surface of the raw material melt can be suppressed, the melt surface becomes like mirror plane even while pulling the silicon single crystal, so that the mirror image of the reference reflector can be observed easily, and the distance between the lower end surface of the heat insulating member and the surface of the raw material melt can be stably and accurately measured.

Furthermore, in the present invention, the distance between the lower end surface of the heat insulating member and the surface of the raw material melt is actually measured first by using a mechanical method or the like, and a location of the mirror image of the reference reflector reflected on the surface of the raw material melt is observed using a fixed-point observing apparatus. Subsequently, during pulling the silicon single crystal, the travel distance of the mirror image is measured by the fixed-point observing apparatus. By calculating the distance between the lower end surface of the heat insulating member and the surface of the raw material melt being pulled from the actually measured value and the travel distance of the mirror image, the measuring range by the image observation is further limited, so that with observational error being reduced, the distance between the lower end surface of the heat insulating member and the surface of the raw material melt can be measured precisely and accurately during pulling the silicon single crystal.

Here, the "reference reflector" in the preset invention is a body arranged at the lower end of the heat insulating member, and its mirror image is reflected on the surface of the raw material melt. By observing this mirror image, the distance between the lower end surface of the heat insulating member and the surface of the raw material melt can be calculated and the location of the surface of the raw material melt can be controlled.

Here, as the reference reflector, a reference reflector out of any one of high-purity quartz, silicon and carbon is preferably used.

By thus using a reference reflector out of any one of high-purity quartz, silicon and carbon as the reference reflector mounted at the lower end of the heat insulating member, there is only slight risk that the reference reflector may contaminate a growing silicon single crystal with impurities. Thereby a high-quality silicon single crystal can be grown.

Additionally, as the reference reflector, a reference reflector out of high-purity white quartz or high-purity transparent quartz having a whitened surface is preferably used.

By thus using a reference reflector out of high-purity white quartz or high-purity transparent quartz having a whitened surface as the reference reflector mounted at the lower end of the heat insulating member, there is no risk that the silicon single crystal may be contaminated with particles due to the degradation of the reference reflector during pulling the silicon single crystal. In addition, since the reference reflector is white, visibility of mirror images on the surface of the raw material melt is improved, and the observation of mirror images can be achieved more accurately, so that a silicon single crystal with high purity and a high quality can be grown.

Furthermore, in the present invention, the initial distance between the lower end surface of the heat insulating member and the surface of the raw material melt is set by contacting a projection provided at the lower end of the heat insulating member with the surface of the raw material melt by raising the crucible. The projection has a known length that is greater than the length of the reference reflector.

Because the projection has a known length, the initial distance between the lower end surface of the heat insulating member and the surface of the raw material melt can be determined with a simple operation. In addition, since the projection is longer than the reference reflector, there is no risk that the raw material melt may be attached to the reference reflector when the crucible is raised so as to contact the projection with the surface of the raw material melt.

As the projection, a projection out of any one of quartz, silicon and carbon is preferably used.

By thus using a projection out of any one of quartz, silicon and carbon as the projection provided at the lower end of the heat insulating member, even if the projection, which is contacted with the raw material melt, is melt in the raw material melt for example, there is only slight risk that the raw material melt is contaminated with impurities, so that a high-quality silicon single crystal can be grown.

Furthermore, in the present invention, the initial distance between the lower end surface of the heat insulating member and the surface of the raw material melt is set based on the positioning of a lower end of a seed crystal for growing the silicon single crystal. A reference location of the lower end of the seed crystal is detected by a measurement apparatus that is arranged above the raw material melt. Subsequently, the lower end of the seed crystal is lowered between the lower end of the reference reflector and the surface of the raw material melt. The crucible is then raised so that the lower end of the seed crystal is contacted with the surface of the raw material melt. The distance between the lower end surface of the heat insulating member and the surface of the raw material melt is determined based on the distance between the contact location and the reference location as well as the distance between the lower end surface of the heat insulating member and the reference location.

By thus detecting the lower end of the seed crystal for growing the silicon single crystal by an apparatus for detecting a reference location arranged above the raw material melt so as to give the location as a reference location; subsequently lowering the lower end of the seed crystal between the lower end of the reference reflector and the surface of the raw material melt; contacting the lower end of the seed crystal with the surface of the raw material melt by raising the crucible so as to actually measure the distance between the lower end surface of the heat insulating member and the surface of the raw material melt based on the distance between the contact location and the reference location as well as the distance between the lower end surface of the heat insulating member and the reference location, the distance between the lower end surface of the heat insulating member and the surface of the raw material melt can be actually measured by a simple operation. In addition, since the distance between the lower end surface of the heat insulating member and the surface of the raw material melt is actually measured by means of a seed crystal, there is only slight risk of the raw material melt being contaminated with impurities, so that a high-quality silicon single crystal can be grown. Furthermore, by lowering the lower end of the seed crystal between the lower end of the reference reflector and the surface of the raw material melt, when the lower end of the seed crystal is contacted with the surface of the raw material melt by raising the crucible, there is no risk that the raw material melt is attached to the reference reflector.

It is preferable in the present invention that a central magnetic field intensity of the applied magnetic field is a horizontal magnetic field of 300 G to 7000 G.

Since by thus setting the central magnetic field intensity of the applied magnetic field during measurement to be a horizontal magnetic field of 300 G to 7000 G, the surface of the raw material melt is hardly fluctuated, fluctuation of the mirror image reflected on the surface of the raw material melt can be suppressed, so that the location of the surface of the raw material melt can be stabilized, and consequently the travel distance of the mirror image can be more accurately measured.

There is also provided in accordance with the present invention, a method for controlling a distance between a lower end surface of a heat insulating member and a surface of a raw material melt, characterized in that the distance between the lower end surface of the heat insulating member and the surface of the raw material melt measured by the above-mentioned method for measuring the distance between the lower end surface of the heat insulating member and the surface of the raw material melt is fed back while pulling the silicon single crystal; and the crucible or the heat insulating member is moved such that the distance between the lower end surface of the heat insulating member and the surface of the raw material melt takes a setting value.

As mentioned above, the distance between the lower end surface of the heat insulating member and the surface of the raw material melt measured by the above-mentioned method for measuring the distance between the lower end surface of the heat insulating member and the surface of the raw material melt is fed back while pulling the silicon single crystal; and the crucible or the heat insulating member is moved such that the distance between the lower end surface of the heat insulating member and the surface of the raw material melt takes a setting value. Since the distance between the lower end surface of the heat insulating member and the surface of the raw material melt can be thereby measured more stably and more accurately, the distance between the lower end surface of the heat insulating member and the surface of the raw material melt can be controlled highly precisely if the distance between the lower end surface of the heat insulating member and the surface of the raw material melt is controlled based on this measurement result.

There is provided in the present invention a method for manufacturing a silicon single crystal, characterized in that a distance between a lower end surface of a heat insulating member and a surface of a raw material melt is controlled by the above-mentioned method for controlling the distance between the lower end surface of the heat insulating member and the surface of the raw material melt so as to manufacture a silicon single crystal.

Since by thus manufacturing the silicon single crystal by the above-mentioned controlling method, the distance between the lower end surface of the heat insulating member and the surface of the raw material melt can be controlled highly precisely, the temperature gradient of the crystal axis in the direction of the crystal growth axis can be controlled extremely precisely, so that a high-quality silicon single crystal can be manufactured efficiently and with high productivity.

Furthermore, the above-mentioned method for manufacturing a silicon single crystal is a method where the manufactured silicon single crystal can be defect-free on the entire plane in the radial direction.

By thus using the above-mentioned method for measuring the distance between the lower end surface of the heat insulating member and the surface of the raw material melt in a method for manufacturing a silicon single crystal, a defect-free silicon single crystal on the entire plane in the radial direction can be pulled.

As mentioned above, in accordance with a method for measuring the distance between the lower end surface of the heat insulating member and the surface of the raw material melt according to the present invention, the distance between the lower end surface of the heat insulating member and the surface of the raw material melt can be measured more stably and more accurately. By controlling the distance between the lower end surface of the heat insulating member and the surface of the raw material melt based on the measurement result, the distance between the lower end surface of the heat insulating member and the surface of the raw material melt can be controlled highly precisely. Therefore, the temperature gradient of the crystal axis in the direction of the crystal growth axis can be controlled extremely precisely, so that a high-quality silicon single crystal can be manufactured efficiently and with high productivity.

BRIEF DESCRIPTION OF THE DRAWINGS

FIG. 1(a) is a view illustrating the movement of the surface of the raw material melt and locational relationship of each member and FIG. 1(b) is a schematic view of images obtained by a fixed-point observing apparatus;

FIG. 3(a) shows the method in a case of using a projection and FIG. 3(b) shows the method in a case of using a seed crystal;

BEST MODE(S) FOR CARRYING OUT THE INVENTION

Figure 1:
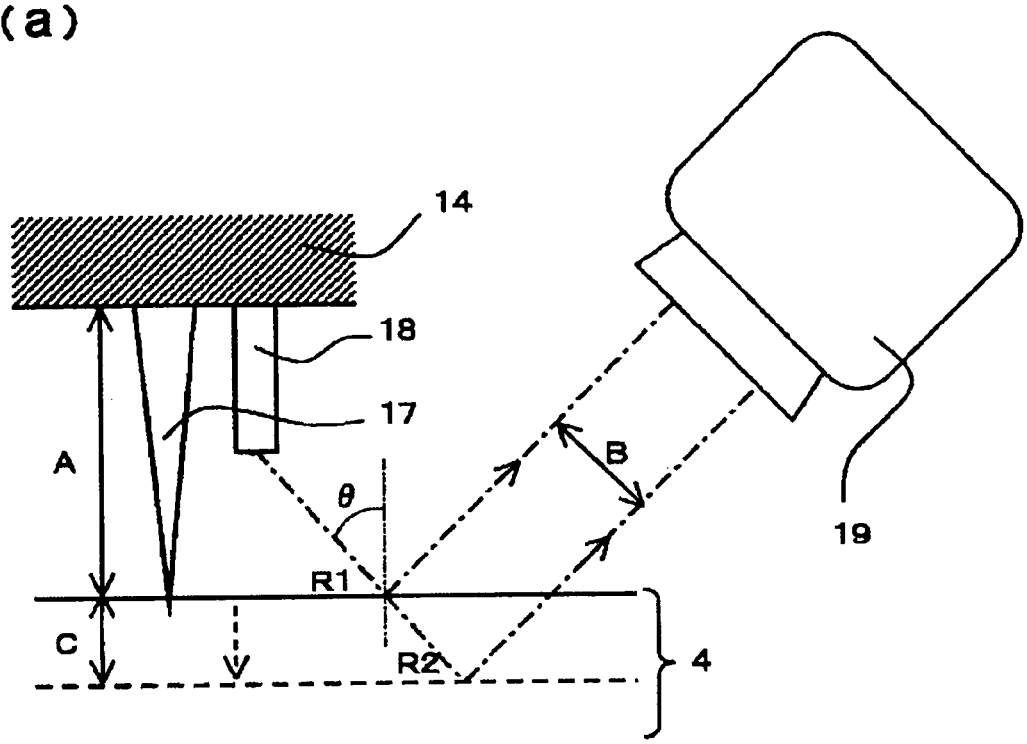
FIG. 1 is a view illustrating a method for measuring the distance between the lower end surface of the heat insulating member and the surface of the raw material melt in accordance with the present invention, where
Figure 1:
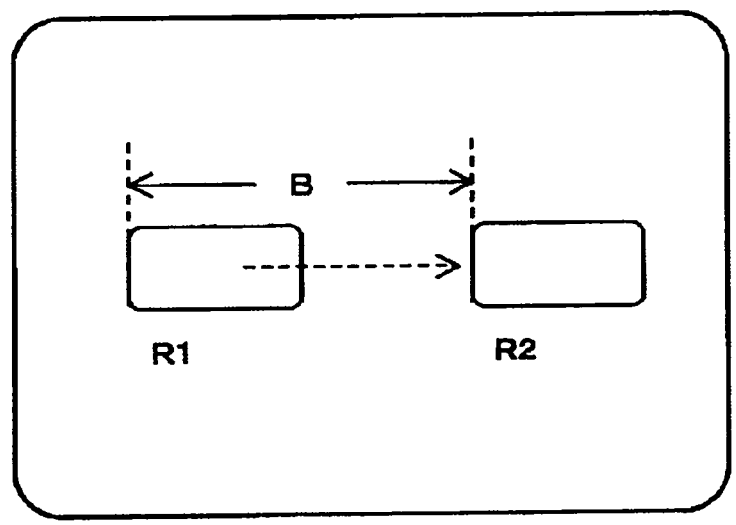

Hereinbelow, the present invention is described more in detail.

As mentioned above, conventionally a reference reflector is provided in a CZ furnace and by measuring a relative distance between a real image of the reference reflector and a mirror image of the reference reflector reflected on the melt surface, the distance between the reference reflector and the melt surface is measured. The measurement is performed such that the real image of the reference reflector and the mirror image of the reference reflector are captured by a detecting means such as an optical camera or the like, and then brightness of the captured real and mirror images of the reference reflector is quantized to two output levels (binarization process) by determining a constant threshold (threshold for binarization level).

However, there is a problem that the distance between the reference reflector and the melt surface cannot be stably and accurately measured since the brightness of the mirror image of the reference reflector reflected on the melt surface is changed over the time period of the crystal growth process and as a result a detection value by the optical camera before the binarization varies, or since a noise which is not a mirror image of the reference reflector such as a splash of melt attached to a structural part in the CZ furnace is detected.

As an another problem, if a silicon single crystal having a diameter of 300 mm or more is manufactured, for example, the melt surface is fluctuated, so that an accurate location of the melt surface cannot be stably detected.

If the measurement result of the relative distance between the reference reflector and the melt surface is thus inaccurate, an interval between the melt surface and the heat insulating member cannot be controlled precisely to be a predetermined interval. As a result a silicon single crystal with a desired quality cannot be manufactured with good productivity.

The inventors of the present invention have diligently studied and examined in order to solve these problems, have accordingly found that in order to more stably and more correctly measure the distance between the lower end surface of a heat insulating member and the surface of the raw material melt, a silicon single crystal is pulled while a magnetic field being applied, the distance between the lower end surface of the heat insulating member and the surface of the raw material melt is actually measured; subsequently a travel distance of a mirror image is measured by a fixed-point observing apparatus while pulling the silicon single crystal; and the distance between the lower end surface of the heat insulating member and the surface of the raw material melt is calculated, from the actually measured value and the travel distance of the mirror image so as to measure the distance between the lower end surface of a heat insulating member and the surface of the raw material melt, and have thereby completed the present invention.

Hereinbelow, embodiments of the present invention are described in reference to the drawing, though the present invention is not limited to them.

Figure 2:
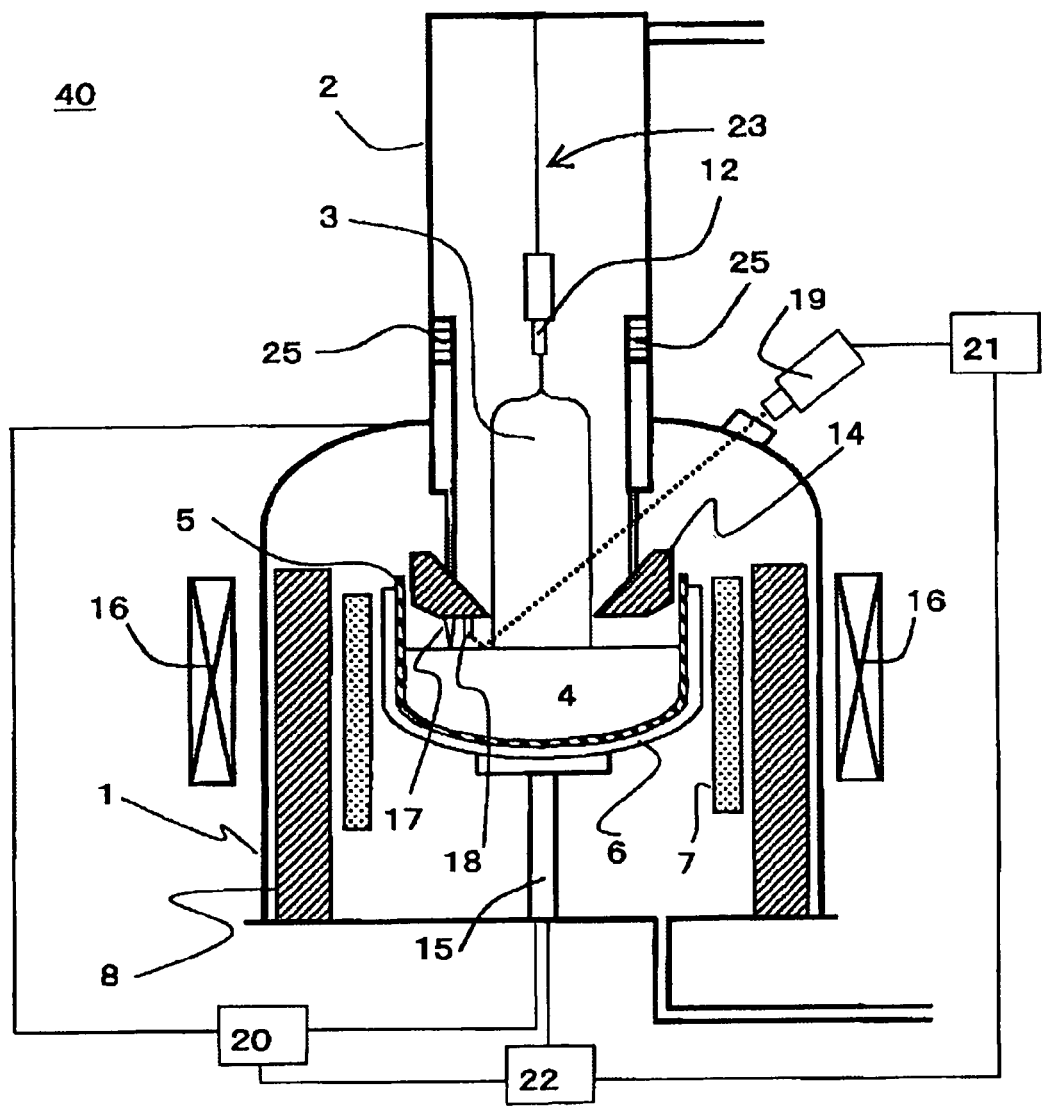
FIG. 2 is a schematic view illustrating a method for measuring the distance between the lower end surface of the heat insulating member and the surface of the raw material melt when a silicon single crystal is pulled in accordance with the present invention.

FIG. 1 is a view illustrating a method for measuring the distance between the lower end surface of the heat insulating member and the surface of the raw material melt in accordance with the present invention, where FIG. 1(a) is a view illustrating the movement of the surface of the raw material melt and locational relationship of each member, and FIG. 1(b) is a schematic view of images obtained by a fixed-point observing apparatus. FIG. 2 is a schematic view illustrating a method for measuring the distance between the lower end surface of the heat insulating member and the surface of the raw material melt when a silicon single crystal is pulled in accordance with the present invention.

Before a silicon single crystal 3 is pulled by a Czochralski method during applying a magnetic field to a raw material melt 4 in a crucible as shown in FIG. 2, a reference reflector 18 is provided at the lower end of a heat insulating member 14 located above the raw material melt 4 as shown in FIG. 1(a). Then a distance A between the lower end of the heat insulating member 14 and the front surface of the raw material melt 4 is actually measured, and location of a mirror image R1 of the reference reflector 18 reflected on the surface of the raw material melt is observed by a fixed-point observing apparatus 19. Subsequently, while pulling of the silicon single crystal 3, a travel distance B of the mirror image is measured by the fixed-point observing apparatus 19, so that the distance between the lower end surface of the heat insulating member and the surface of the raw material melt is calculated from the actually measured value A and the travel distance B of the mirror image.

By thus actually measuring the distance between the lower end surface of the heat insulating member 14 and the front surface of the raw material melt 4; by observing a location of the mirror image of the reference reflector reflected on the surface of the raw material melt using the fixed-point observing apparatus; subsequently during pulling the silicon single crystal by measuring the travel distance of the mirror image by the fixed-point observing apparatus; and by calculating the distance between the lower end surface of the heat insulating member and the surface of the raw material melt from the actually measured value and the travel distance of the mirror image, the measuring range by the image observation is further limited, so that with observational error by the fixed-point observing apparatus being reduced, the distance between the lower end surface of the heat insulating member and the surface of the raw material melt can be measured precisely and accurately during pulling the silicon single crystal.

In addition, by pulling the silicon single crystal while the magnetic field is applied, convection of the raw material melt can be suppressed and as a result waviness of front surface of the raw material melt can be suppressed, so that the melt surface becomes like mirror plane even while pulling the silicon single crystal. Consequently, the mirror image of the reference reflector can be observed easily, and the distance between the lower end surface of the heat insulating member and the surface of the raw material melt can be stably and accurately measured.

When the reference reflector 18 is provided at the lower end of the heat insulating member 14 located above the raw material melt 4 as shown in FIG. 1(a), as the reference reflector 18, a reference reflector out of any one of high-purity quartz, silicon and carbon is preferably used.

By employing a reference reflector made of such a material, there is only slight risk that the reference reflector 18 may contaminate a growing silicon single crystal 3 with impurities, so that a high-quality silicon single crystal 3 can be grown.

Additionally, as the reference reflector 18, a reference reflector out of high-purity white quartz or high-purity transparent quartz having a whitened surface is especially preferably used.

By thus using a reference reflector out of high-purity white quartz or high-purity transparent quartz having a whitened surface as the reference reflector 18 mounted at the lower end of the heat insulating member 14, there is no risk that the silicon single crystal 3 may be contaminated with particles due to the degradation of the reference reflector 18 during pulling the silicon single crystal 3.

As a material for the heat insulating member 14 or the like arranged above the raw material melt 4, graphite material is often employed. When travel of the mirror image is observed by the fixed-point observing apparatus 19, since the graphite material is reflected on the front surface of the silicon melt 4, and since the reference reflector 18 is white, in a case that a reference reflector out of high-purity white quartz or high-purity transparent quartz having a whitened surface is used as the reference reflector 18, visibility of mirror images on the surface of the raw material melt 4 observed by the fixed-point observing apparatus 19 is improved, and the observation of mirror images can be achieved more accurately, so that the silicon single crystal 3 with high purity and a high quality can be grown.

As for examples actually measuring the distance A between the lower end of the heat insulating member 14 and the front surface of the raw material melt 4, two embodiments such as those shown in FIG. 3(a) and FIG. 3(b) can be mentioned.

Figure 3:
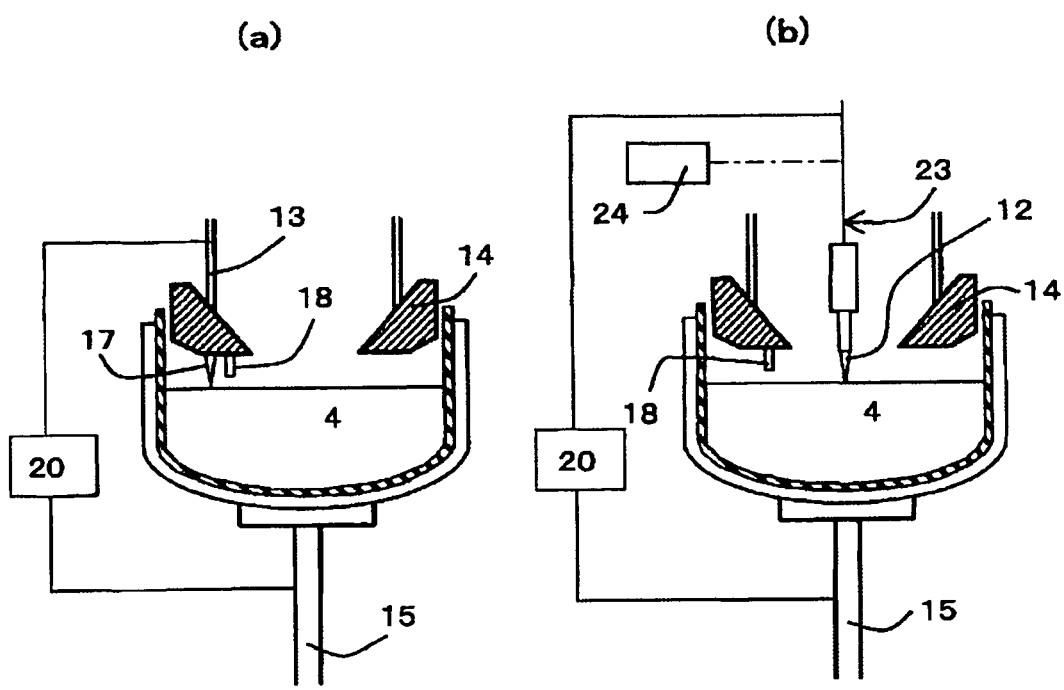
FIG. 3 is a view illustrating a method for actually measuring the distance between the lower end surface of the heat insulating member and the surface of the raw material melt, where

FIG. 3 is a view illustrating a method for actually measuring the distance between the lower end surface of the heat insulating member and the surface of the raw material melt, where FIG. 3(a) shows a case of using a projection and FIG. 3(b) shows a case of using a seed crystal.

As shown in FIG. 3(a), when the distance A between the lower end of the heat insulating member 14 and the front surface of the raw material melt 4 is actually measured using a projection, a projection 17 which is longer than the reference reflector 18 and which has a known length is provided at the lower end of the heat insulating member 14, and the projection 17 is contacted with the raw material melt 4 by raising the crucible.

If the distance A between the lower end of the heat insulating member 14 and the front surface of the raw material melt 4 is thus actually measured, since the length of the projection 17 is known, the distance between the lower end surface of the heat insulating member and the surface of the raw material melt can be actually measured by a simple operation. Since the projection is longer than the reference reflector, there is no risk of the raw material melt being attached to the reference reflector, when the projection is contacted with the surface of the raw material melt by raising the crucible.

In order to detect the contact between the projection 17 and the raw material melt 4, as shown in FIG. 3(a), a gas flow-guide cylinder 13 to which the heat insulating member 14 is mounted, the heat insulating member 14 and the projection 17 are electrically connected, and a crucible axis 15 which holds the crucible filled with the raw material melt 4 and the gas flow-guide cylinder 13 are electrically connected by an actual measurement apparatus 20.

Consequently, when the crucible is raised and the raw material melt 4 is contacted with the projection 17, the actual measurement apparatus 20 detects it electrically. The location of the crucible at this time is recorded. At this location of the crucible, in other words, at the location of the surface of the raw material melt, the distance between the lower end surface of the heat insulating member and the surface of the raw material melt matches with the length of the projection, so that the distance A between the lower end surface of the heat insulating member and the surface of the raw material melt can be actually measured.

As the projection 17, a projection out of any one of quartz, silicon and carbon is preferably used. Silicon is especially more preferable from the viewpoints of electrical resistance and impurity contamination.

By employing the projection 17 out of such material, even if the projection 17 is melt in the raw material melt 4 when contacted with the raw material melt 4, for example, there is only slight risk that the raw material melt 4 is contaminated with impurities, so that a high-quality silicon single crystal can be grown.

If the raw material melt is silicon, silicon, which is the same material, is especially preferably used as a material of the projection 17.

Next, the case using a seed crystal as shown in FIG. 3(b) when the distance A between the lower end of the heat insulating member 14 and the front surface of the raw material melt 4 is actually measured is described. By detecting the lower end of a seed crystal 12 for growing the silicon single crystal 3 by an apparatus for detecting a reference location 24 arranged above the raw material melt 4 (at a pulling chamber for example), giving the location as a reference location; subsequently lowering the lower end of the seed crystal 12 between the lower end of the reference reflector 18 and the surface of the raw material melt 4. Here the lower end of the seed crystal 12 is stopped at a location of the raw material melt surface corresponding with a desired DPM when the crucible is raised so as to contact with the raw material melt 4. Then the crucible is raised so as to contact the lower end of the seed crystal 12 with the raw material melt 4.

Based on the distance between this contact location and the reference location as well as a known distance between the lower end surface of the heat insulating member and the reference location, the distance A between the lower end surface of the heat insulating member and the surface of the raw material melt can be actually measured.

By thus using the seed crystal so as to actually measure the distance A between the lower end surface of the heat insulating member and the surface of the raw material melt, the distance between the lower end surface of the heat insulating member and the surface of the raw material melt can be actually measured by a simple operation. Additionally, since the distance between the lower end surface of the heat insulating member and the surface of the raw material melt is actually measured with a seed crystal, there is also only slight risk of the raw material melt being contaminated with impurities, so that a high-quality silicon single crystal can be grown. Furthermore, by lowering the lower end of the seed crystal between the lower end of the reference reflector and the surface of the raw material melt, there is no risk that the raw material melt is attached to the reference reflector when the seed crystal is contacted with the surface of the raw material melt by raising the crucible.

In order to detect the contact of the seed crystal 12 and the raw material melt 4, a wire 23 hanging the seed crystal 12 and the crucible axis 15 which holds the crucible filled with the raw material melt 4 are electrically connected by an actual measurement apparatus 20 as shown in FIG. 3(b).

Then, when the crucible is raised and the raw material melt 4 is contacted with the seed material 12, the actual measurement apparatus 20 detects it electrically. The location of the crucible at this time is recorded. At this location of the crucible, in other words, at this location of the surface of the raw material melt, the distance between the lower end surface of the heat insulating member and the surface of the raw material melt can be actually measured.

Simultaneously with the distance A between the lower end of the heat insulating member 14 and the front surface of the raw material melt 4 being actually measured by the above-mentioned method, the location of an mirror image R1 of the reference reflector reflected on the surface of the raw material melt is observed by the fixed-point observing apparatus 19.

Next, the silicon single crystal 3 is pulled using an apparatus shown in FIG. 2. This apparatus for manufacturing a silicon single crystal 40 is equipped with a main chamber 1 containing members such as a quartz crucible 5, a pulling chamber 2 continuously arranged above to the main chamber 1, the heat insulating member 14 for controlling the temperature gradient of the crystal, a heater 7 for heating and melting polycrystalline silicon material, a graphite crucible 6 out of graphite holding the quartz crucible 5, a heat insulator 8 for preventing the heat from the heater 7 from being directly radiated to the main chamber 1, the wire 23 for pulling the silicon single crystal, the crucible axis 15 for holding the crucibles 5 and 6, and a control apparatus 22 for controlling the crucible location.

The manufacturing apparatus 40 like this allows the silicon single crystal 3 to be pulled as follows. Before actually measuring the distance between the lower end surface of the heat insulating member and the surface of the raw material melt, polycrystalline silicon material with high purity is contained in the quartz crucible 5 in advance, the material is heated and melt to melting point of silicon (about 1420° C.) or more by the heater 7 arranged around the graphite crucible 6 so as to prepare the raw material melt 4.

Then, as described above, the distance between the lower end of the heat insulating member 14 and the front surface of the raw material melt 4 is actually measured, and the location of the mirror image R1 of the reference reflector reflected on the surface of the raw material melt is observed by the fixed-point observing apparatus 19.

In a case that the distance between the lower end surface of the heat insulating member and the surface of the raw material melt is actually measured by using a projection as shown in FIG. 3(a), the location of the crucible is lowered until a desired DPM is obtained. Then, after the seed crystal 12 is contacted with the raw material melt 4, the pulling wire 23 is wound gently by a (not shown) reel mechanism, a neck portion is formed, and then the crystal diameter is increased so as to grow a portion having a constant diameter.

Here, the silicon single crystal 3 is pulled during applying a magnetic field to the raw material melt by a magnet 16. The central magnetic field intensity (central magnetic field intensity of the line connecting coil centers) of the magnetic filed being applied is especially preferable a horizontal magnetic field of 300 G to 7000 G. By setting such a magnetic field intensity, since the surface of the raw material melt is hardly fluctuated, the fluctuation of the mirror image reflected on the surface of the raw material melt can be suppressed, so that the location of the surface of the raw material melt can be stabilized, and consequently the travel distance of the mirror image can be more accurately measured.

Next, a method for measuring the distance between the lower end surface of the heat insulating member and the surface of the raw material melt while pulling the silicon single crystal 3 is described. The location of the mirror image of the reference reflector 18 is moved from that of the mirror image R1 of the reference reflector 18 reflected on the raw material melt captured by the fixed-point observing apparatus 19 before pulling the silicon single crystal, to the location of the mirror image R2 of the reference reflector 18 when the silicon single crystal is pulled and the surface of the raw material melt is lowered.

Here, the travel distance B of the mirror image from the location R1 to the location R2 is converted to the travel distance C of the surface of the raw material melt by means of a measurement calculation apparatus 21 connected to the fixed-point observing apparatus 19. This conversion can be performed geometrically by calculating from the location and angle of the fixed-point observing apparatus 19 and the like as follows:

$$B = 2C \sin \theta$$

where the travel distance of the raw material melt is given as C, the travel distance of the mirror image is given as B, and the reflection angle of the mirror image is given as $\theta$. Thus, the travel distance C of the raw material melt can be evaluated from the travel distance B of the mirror image obtained by the fixed-point observing apparatus 19, and the DPM in a case of the mirror image being in a location R2 can be evaluated by adding the actually measured value A to the travel distance C of the raw material melt.

Here, if $\theta \geq 30°$, then C<B, so that a slight travel of the raw material melt can be measured by enlarging it by the travel of the mirror image.

In order to calculate the DPM more accurately, however, conversion coefficient may be evaluated in advance from the travel distance B of the mirror image observed before the silicon single crystal is pulled, specifically when the crucible location, i.e., the surface of the raw material melt is lowered by 20 mm, for example.

Though the fixed-point observing apparatus 19 is not specifically limited, an optical camera (such as a CCD camera), which is generally used, can be mentioned as an example.

By thus setting and by only capturing the travel distance B of the mirror image by means of the fixed-point observing apparatus 19 while pulling the silicon single crystal, the distance between the lower end surface of the heat insulating member and the surface of the raw material melt can be precisely calculated from the actually measured value A of the DPM before pulling the silicon single crystal and the travel distance C of the surface of the raw material melt calculated from the travel distance B of the mirror image.

The actually measured value A of the DPM before pulling the silicon single crystal can be calculated by the control apparatus 22 for controlling the crucible location.

Next, in order to control the distance between the lower end surface of the heat insulating member and the surface of the raw material melt, the travel distance of the mirror image is always observed while pulling the silicon single crystal, and the distance between the lower end surface of the heat insulating member and the surface of the raw material melt measured by the above-mentioned method for measuring the distance between the lower end surface of the heat insulating member and the surface of the raw material melt is fed back as needed. The crucible 5 and 6 or the heat insulating member 14 are preferably moved such that the distance between the lower end surface of the heat insulating member and the surface of the raw material melt takes a setting value. The crucible axis 15 may be moved up or down in order to move the crucible, while the gas flow-guide cylinder may be moved up or down by a travel mechanism 25 for the gas flow-guide cylinder in order to move the heat insulating member.

By thus feeding back the DPM measurement value while pulling the silicon single crystal, and by moving the crucible or the heat insulating member such that the distance between the lower end surface of the heat insulating member and the surface of the raw material melt takes a setting value, the distance between the lower end surface of the heat insulating member and the surface of the raw material melt can be highly preciously controlled.

In order to grow a high-quality silicon single crystal such as a defect-free crystal, the distance (DPM) between the raw material melt and the heat insulating member arranged above it is very important. The reason for this is as follows. First, manufacturing margin for a defect-free crystal is very narrow, and it needs to be accomplished in all directions on the crystal plane. Since the temperature gradient around the crystal varies very much by changing the DPM, the DPM can be used as a control factor for equalizing the temperature gradient in the central region and the surrounding region. Furthermore, since the temperature gradient on the plane varies in the longitudinal direction of the crystal, the DPM needs to be changed depending on the crystal length so as to fabricate a defect-free crystal in the entire longitudinal direction of the crystal.

Therefore, if the distance between the lower end surface of the heat insulating member and the surface of the raw material melt is controlled by the above-mentioned method for controlling the lower end surface of the heat insulating member and the surface of the raw material melt so as to manufacture a silicon single crystal, the distance between the lower end surface of the heat insulating member and the surface of the raw material melt can be controlled highly precisely, so that the temperature gradient of the crystal axis in the direction of the crystal growth axis can be controlled extremely precisely. Consequently, a high-quality silicon single crystal can be manufactured efficiently and with high productivity.

Furthermore, by making the manufactured silicon single crystal manufactured by the above-mentioned method for manufacturing a silicon single crystal defect-free on the entire plane in the radial direction, the defect-free region of the silicon single crystal can be enlarged, so that manufacturing yield of the silicon single crystal can be further improved.

The present invention is described more in detail in reference to examples of the present invention, though the present invention is not limited to the examples.

EXAMPLE 1

As an apparatus for manufacturing a silicon single crystal, an apparatus for manufacturing a silicon single crystal 40 shown in FIG. 2 was used.

First, at a lower end of the heat insulating member 14, a projection 17 and a reference reflector 18 were mounted.

As the reference reflector 18, a hard and transparent quartz rod of which tip a white quartz was affixed was used.

The projection 17 had a length which was shorter than a DPM setting value while pulling a silicon single crystal 3 and which was longer than the length of the reference reflector 18, had such a material and a form that the silicon single crystal was conically cutted and its front surface was etched and cleaned to be a mirror plane. After mounting the projection 17, the length of the projection 17 projecting below the heat insulating member was measured, so that it was confirmed that the length was shorter than the initial setting DPM at the beginning of pulling a silicon single crystal by 20 mm.

First, a quartz crucible 5 having a bore diameter of 800 mm (for pulling a silicon single crystal having a diameter of 300 mm) was filled with 340 kg polycrystalline silicon material. After melting the polycrystalline silicon material by a heater 7, a horizontal magnetic field having a central magnetic field intensity of 4000 G was applied by a magnet 16.

Then the crucible was raised slowly and moved until the projection 17 mounted at the lower end of the heat insulating member 14 was contacted with a raw material melt 4. The contact of the raw material melt 4 with the projection 17 was detected by means of a measurement apparatus 20 by electricity flowing from the heat insulating member 14 to a crucible axis 15.

The DPM at the detecting moment was given as DPM setting value—20 mm, and a location R1 of the mirror image of the reference reflector 18 reflected on the surface of the raw material melt was detected by a fixed-point observing apparatus (camera) 19.

Next, the crucible was lowered by 20 mm so as to match the location with the initial location of the surface of the raw material melt at the beginning of pulling the silicon single crystal. At the same time conversion factor was determined, too. In other words, a travel distance B of the mirror image was measured when the crucible was moved by 20 mm (i.e. a travel distance C of the surface of the raw material melt) so as to allow the travel distance C of the surface of the raw material melt while pulling the silicon single crystal to be calculated from the travel distance B of the mirror image.

After the setting was thus completed, the silicon single crystal was pulled. As described above, in order to make a large defect-free crystal region in the pulled silicon single crystal, the DPM was preferably varied as needed during manufacturing the crystal. Therefore, the silicon single crystal 3 was pulled such that the DPM was controlled by a control apparatus 22 for controlling the crucible location such that the DPM might take the most preferable pattern.

Figure 4:
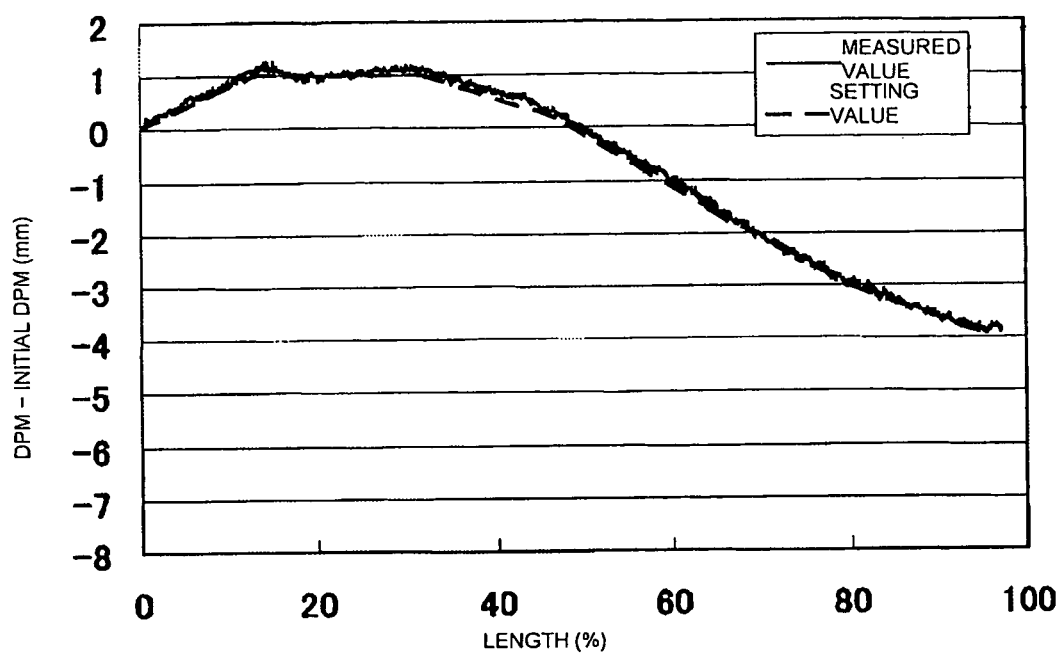
FIG. 4 is a view showing measured values of DPM measured by a DPM measuring method in accordance with the present invention and setting values of DPM (with respect to Examples 1 and 2)
Figure 5:
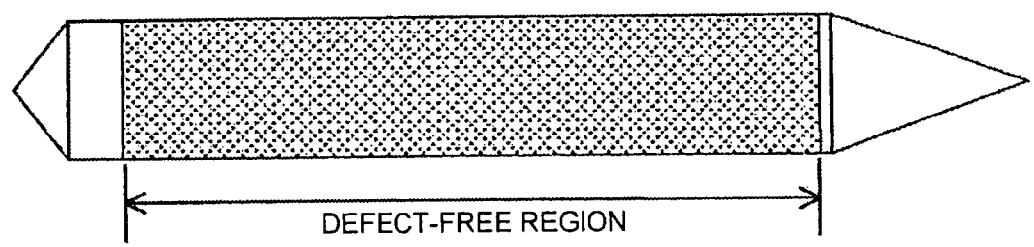
FIG. 5 is a schematic view illustrating a silicon single crystal obtained by controlling the DPM as in FIG. 4.

The DPM setting values and measurement values of Example 1 are shown in FIG. 4, while a schematic view illustrating a silicon single crystal obtained by controlling the DPM as in FIG. 4 is shown in FIG. 5. FIG. 4 is a view showing measured and setting values of the DPM measured by a DPM measuring method in accordance with the present invention. In order to read out a subtle change in the DPM in a graph of FIG. 4, the values in the longitudinal axis in FIG. 4 are those deducting the initial DPM value at the beginning of pulling the silicon single crystal from the measured DPM values, while the ratio of the length of the pulled silicon single crystal in the direction of the growth axis was plotted on the scale of the horizontal axis.

From FIG. 4, it is apparent that the DPM could be controlled in the same way as the DPM setting values. Thereby, it is apparent that a quality of the crystal pulled by this method is as shown in FIG. 5, and a silicon single crystal, which is defect-free almost on the entire plane, could be manufactured.

EXAMPLE 2

A silicon single crystal 3 was pulled in the similar way as in Example 1, other than that the distance between the lower end of the heat insulating member and the front surface of the raw material melt was actually measured by using a seed crystal.

Note that the method of actually measuring a DPM using the seed crystal was as follows. First lower end of a seed crystal 12 was detected by an apparatus for detecting a reference location 24 as shown in FIG. 3(*b*), so that the location was set as a reference location. Then the lower end of the seed crystal 12 was stopped at a location corresponding with a desired DPM of the surface of the raw material melt when the crucible was raised so as to contact with the raw material melt 4. Then the crucible was raised so as to contact the lower end of the seed crystal 12 with the raw material melt 4. Based on the distance between this contact location and the reference location as well as a known distance between the lower end surface of the heat insulating member and the reference location, a distance A between the lower end surface of the heat insulating member and the surface of the raw material melt was actually measured.

As the result of controlling the DPM as in Example 2, similar result shown in Example 1 could be obtained. In other words, the DPM could be controlled such that the DPM measurement values almost matched with the setting values similarly in FIG. 4, so that a manufactured silicon single crystal thus obtained by this method was a silicon single crystal which was defect-free almost in the entire plane as shown in FIG. 5, similarly as in Example 1.

COMPARATIVE EXAMPLE

A silicon single crystal was pulled under the same conditions as in the Examples except that the DPM was controlled. Here the crucible was moved up or down by calculating a volume of a quartz crucible 5 from its inner diameter, by utilizing the fact that the raw material melt was lowered by the amount corresponding to the weight of the pulled silicon single crystal, and by raising the crucible for compensating the amount in the longitudinal direction so as to locate the crucible with the desired DPM in the longitudinal direction by calculating the DPM.

Figure 6:
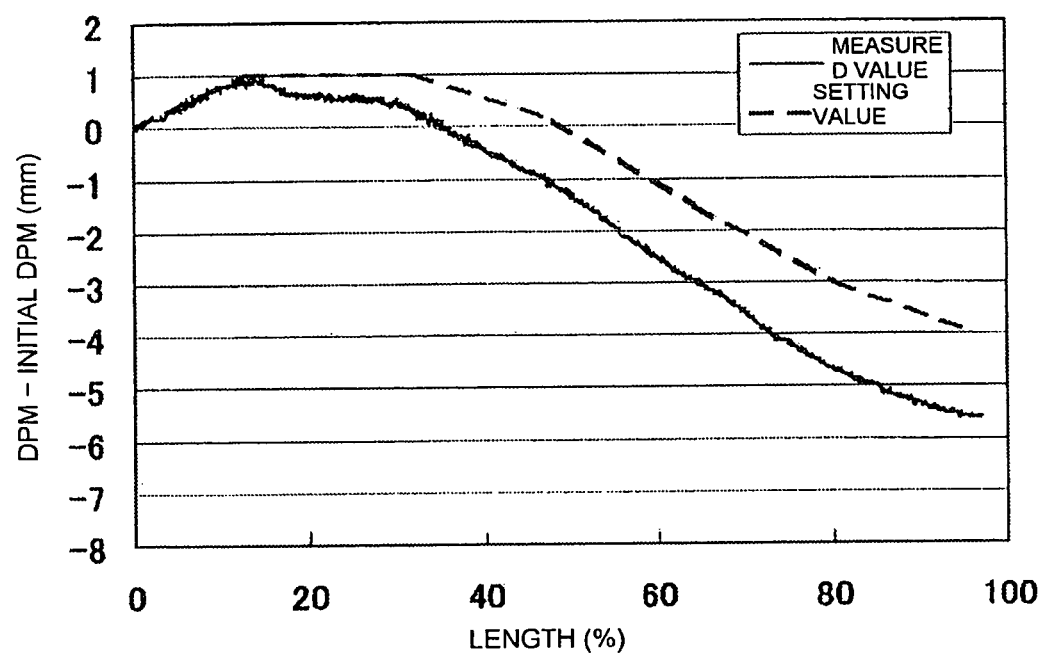
FIG. 6 is a view showing measured values of DPM measured by a conventional DPM measuring method and setting values of DPM (Comparative Example)
Figure 7:
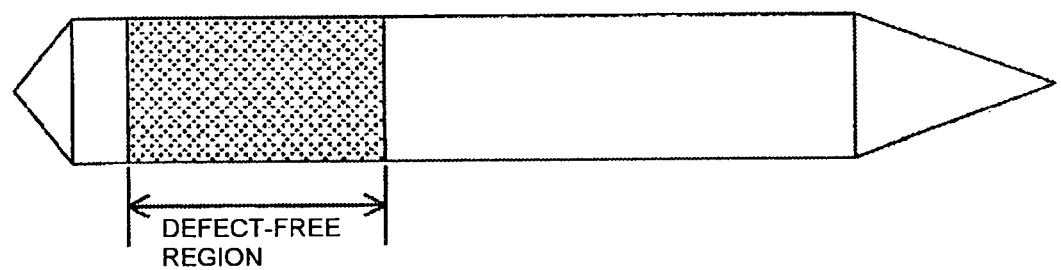
FIG. 7 is a schematic view illustrating a silicon single crystal obtained by controlling the DPM as in FIG. 6.

The DPM setting values and measurement values of the Comparative Example are shown in FIG. 6, while a schematic view illustrating a silicon single crystal obtained by controlling the DPM as in FIG. 6 is shown in FIG. 7. FIG. 6 is a view showing the DPM setting values and measurement values measured by a conventional DPM measuring method. It was apparent as shown in FIG. 6, the DPMs were as a result deviated from the setting values from the location of the silicon single crystal of which length was about 20%. The quality of the crystal was as shown in FIG. 7, and the crystal was a defect-free crystal in the first-half area, while it was not a defect-free crystal in the latter-half area.

It was considered that the DPM did not match with the calculated value because the graphite crucible 6 was degraded. The graphite crucible 6 had a lesser thickness over time. It was considered that the quartz crucible 5, which was soft at high temperature, was deformed by sticking to a graphite crucible 6, so that the inner diameter was increased as a result. Therefore, the lowering amount of the surface of the raw material melt was assumingly smaller than the calculated value, so that DPM was narrow than the setting value.

The present invention is not limited to the embodiments described above. The above-described embodiments are merely exemplarily in nature, and any of those having the substantially same constitution as the technical idea described in the appended claims and providing the similar working effects are included in the scope of the technical range of the present invention.

The invention claimed is:

1. A method for measuring a distance between a lower end surface of a heat insulating member and a surface of a raw material melt with a reference reflector provided at a lower end of the heat insulating member which is located above the surface of the raw material melt when a silicon single crystal is pulled up by a Czochralski method while a magnetic field is applied to the raw material melt in a crucible, the method comprising the steps of:

before pulling the silicon single crystal,
adjusting the distance between the lower end surface of the heat insulating member and the surface of the raw material melt so as to be an initial distance by (1) contacting a projection provided at the lower end of the heat insulating member with the surface of the raw material melt by raising the crucible, the projection being longer than the reference reflector and having a length corresponding to the initial distance, and (2) electrically detecting the contact between the projection and the raw material melt using a measurement apparatus that is electrically connected to the projection and the crucible, and
observing an initial location of a mirror image of the reference reflector by a camera when the distance between the lower end surface of the heat insulating member and the surface of the raw material melt has been adjusted so as to be the initial distance, the mirror image being reflected on the surface of the raw material melt; and
while pulling the silicon single crystal, measuring a travel distance of the mirror image from the initial location by the camera and calculating the distance between the lower end surface of the heat insulating member and the surface of the raw material melt from the initial distance and the travel distance of the mirror image.

2. The method for measuring a distance between a lower end surface of a heat insulating member and a surface of a raw material melt according to claim 1, wherein any one of high-purity quartz, silicon and carbon is used as the reference reflector.

3. The method for measuring a distance between a lower end surface of a heat insulating member and a surface of a raw material melt according to claim 1, wherein high-purity white quartz or high-purity transparent quartz having a whitened surface is used as the reference reflector.

4. A method for controlling a distance between a lower end surface of a heat insulating member and a surface of a raw material melt when a silicon single crystal is pulled up by a Czochralski method, comprising:

while pulling the silicon single crystal, measuring the distance between the lower end surface of the heat insulating member and the surface of the raw material melt by the method for measuring according to claim 3; and
moving the crucible or the heat insulating member on the basis of the measured distance such that the distance between the lower end surface of the heat insulating member and the surface of the raw material melt becomes a setting value.

5. The method for measuring a distance between a lower end surface of a heat insulating member and a surface of a raw material melt according to claim 1, wherein any one of quartz, silicon and carbon is used as the projection.

6. A method for controlling a distance between a lower end surface of a heat insulating member and a surface of a raw material melt when a silicon single crystal is pulled up by a Czochralski method, comprising:

while pulling the silicon single crystal, measuring the distance between the lower end surface of the heat insulating member and the surface of the raw material melt by the method for measuring according to claim 5; and moving the crucible or the heat insulating member on the basis of the measured distance such that the distance between the lower end surface of the heat insulating member and the surface of the raw material melt becomes a setting value.

7. The method for measuring a distance between a lower end surface of a heat insulating member and a surface of a raw material melt according to claim 1, wherein a central magnetic field intensity of the applied magnetic field is a horizontal magnetic field of 300 G to 7000 G.

8. A method for controlling a distance between a lower end surface of a heat insulating member and a surface of a raw material melt when a silicon single crystal is pulled up by a Czochralski method, comprising:

while pulling the silicon single crystal, measuring the distance between the lower end surface of the heat insulating member and the surface of the raw material melt by the method for measuring according to claim 7; and moving the crucible or the heat insulating member on the basis of the measured distance such that the distance between the lower end surface of the heat insulating member and the surface of the raw material melt becomes a setting value.

9. A method for controlling a distance between a lower end surface of a heat insulating member and a surface of a raw material melt when a silicon single crystal is pulled up by a Czochralski method, comprising:

while pulling the silicon single crystal, measuring the distance between the lower end surface of the heat insulating member and the surface of the raw material melt by the method for measuring according to claim 1; and moving the crucible or the heat insulating member on the basis of the measured distance such that the distance between the lower end surface of the heat insulating member and the surface of the raw material melt becomes a setting value.

\* \* \* \* \*